(12) United States Patent
Anderson et al.

(10) Patent No.: US 11,791,258 B2
(45) Date of Patent: Oct. 17, 2023

(54) CONDUCTIVE LINES WITH SUBTRACTIVE CUTS

(71) Applicant: INTERNATIONAL BUSINESS MACHINES CORPORATION, Armonk, NY (US)

(72) Inventors: Brent Anderson, Jericho, VT (US); Lawrence A. Clevenger, Saratoga Springs, NY (US); Kisik Choi, Watervliet, NY (US); Nicholas Anthony Lanzillo, Wynantskill, NY (US); Christopher J. Penny, Saratoga Springs, NY (US); Robert Robison, Rexford, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 112 days.

(21) Appl. No.: 17/679,719

(22) Filed: Feb. 24, 2022

(65) Prior Publication Data

US 2022/0181255 A1 Jun. 9, 2022

Related U.S. Application Data

(62) Division of application No. 16/749,476, filed on Jan. 22, 2020, now Pat. No. 11,276,639.

(51) Int. Cl.
| | | |
|---|---|---|
| *H01L 23/522* | (2006.01) | |
| *H01L 21/768* | (2006.01) | |
| *H01L 23/528* | (2006.01) | |
| *H01L 21/311* | (2006.01) | |

(52) U.S. Cl.
CPC .... *H01L 23/5226* (2013.01); *H01L 21/31144* (2013.01); *H01L 21/76816* (2013.01); *H01L 21/76897* (2013.01); *H01L 23/5283* (2013.01)

(58) Field of Classification Search
CPC .......... H01L 23/5226; H01L 21/76897; H01L 23/5283; H01L 21/31144; H01L 21/76816
USPC ......................................................... 257/664
See application file for complete search history.

(56) References Cited

U.S. PATENT DOCUMENTS

| | | | |
|---|---|---|---|
| 8,148,052 | B2 | 4/2012 | Vanleenhove et al. |
| 8,921,225 | B2 | 12/2014 | Yuan et al. |
| 8,954,913 | B1 | 2/2015 | Yuan et al. |
| 9,711,372 | B2 | 7/2017 | Lee et al. |
| 9,818,640 | B1 | 11/2017 | Stephens et al. |
| 9,818,641 | B1 | 11/2017 | Bouche et al. |
| 10,347,506 | B2 | 7/2019 | Fan et al. |
| 11,276,639 | B2 * | 3/2022 | Anderson ......... H01L 21/76897 |
| 2015/0056800 | A1 | 2/2015 | Mebarki et al. |
| 2019/0103272 | A1 | 4/2019 | Tsai et al. |

OTHER PUBLICATIONS

List of IBM Patents or Patent Applications Treated as Related dated Feb. 24, 2022, 2 pages.
Chen, J. et al., "Segment Removal Strategy in SAQP for Advanced BEOL Application" 2017 IEEE International Interconnect Technology Conference (IITC) (Jul. 2017) pp. 1-3.

\* cited by examiner

*Primary Examiner* — Caleen O Sullivan
(74) *Attorney, Agent, or Firm* — Tutunjian & Bitetto, P.C.; Randy Emilio Tejeda

(57) ABSTRACT

Integrated chips include a dielectric layer that includes at least one trench and at least one plug region. A line is formed in the dielectric layer in the at least one trench and terminates at the plug region. A dielectric plug is formed in the plug region.

20 Claims, 7 Drawing Sheets

CONDUCTIVE LINES WITH SUBTRACTIVE CUTS

BACKGROUND

The present invention generally relates to integrated chip fabrication and, more particularly, to the fabrication of multi-layer integrated chips with conductive lines.

Patterning interconnects with small dimensions, for example less than about 50 nm, can be challenging, with complex hardmask memorization layers being used to assemble lines and cuts. Complex hardmask stacks often involve multiple consecutive layers of different materials, necessitating multiple etches to get through each layer, which can result in a poor-quality final pattern. Additionally, complex hardmask stacks increase both cost and processing time, and the increased number of masks increases the likelihood of mispositioning errors.

SUMMARY

An integrated chip includes a dielectric layer, that includes at least one trench and at least one plug region. A line is formed in the dielectric layer in the at least one trench and that terminates at the plug region. A dielectric plug is formed in the plug region.

An integrated chip includes a dielectric layer that includes a trench and two plug regions. A line is formed in the dielectric layer in the trench between the two plug regions and terminates at the plug regions. Dielectric plugs are formed in the two plug regions.

An integrated chip includes a dielectric layer that includes two trenches and a plug regions. Lines are formed in the dielectric layer in the trenches with the plug region between the lines, terminating at the plug region. A dielectric plug is formed in the plug region.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention form conductive lines in an integrated chip by forming cuts before patterning the conductive lines themselves. This avoids the need for complex hardmask patterns. Openings are formed in a metal layer and dielectric material is deposited to fill the openings. When the lines are subsequently patterned, they will terminate at the deposited dielectric fills, with no need for further cut processes. Additionally, because the interlayer dielectric is then formed after the lines and the cuts have already been formed, there is no need to perform an anisotropic etch that could potentially damage the interlayer dielectric. This makes it possible to use materials that are less robust, such as low-k dielectric materials, thereby reducing parasitic capacitances.

Figure 1:
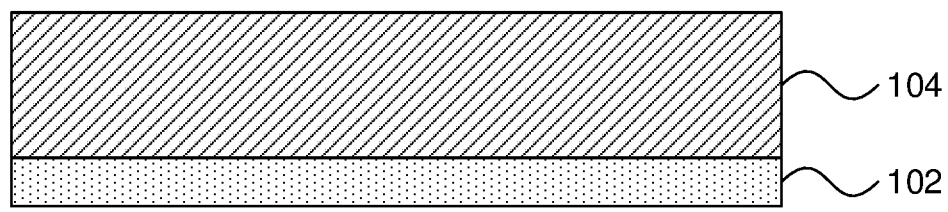
FIG. 1 is a cross-sectional view of a step in the fabrication of conductive lines in a multi-layer integrated chip using subtractive cuts, showing the formation of a conductive layer on a substrate, in accordance with an embodiment of the present invention.

Referring now to the drawings in which like numerals represent the same or similar elements and initially to FIG. 1, a cross-sectional view of a step in the fabrication of a multi-layer integrated chip is shown. A substrate layer 102 is shown. In some embodiments, the substrate layer 102 can be formed from, e.g., a dielectric material such as silicon dioxide or a glass material. The substrate layer 102 can include active and/or passive electronic components, such as transistors, capacitors, transmission lines, vias, etc. There can additionally be one or more further layers underlying the substrate layer 102, with connectivity between the layers being provided by via structures.

A layer of conductive material 104 is formed over the substrate layer 102. In embodiments where the substrate layer 102 includes vias to its surface, the conductive layer 104 will make electrical contact with the vias to provide electrical communication between the layers. The conductive layer 104 can be formed from any appropriate conductive material, for example a metal, such as tungsten, nickel, titanium, molybdenum, tantalum, copper, platinum, silver, gold, ruthenium, iridium, rhenium, rhodium, and alloys thereof. The conductive layer 104 can alternatively be formed from a doped semiconductor material such as, e.g., doped polysilicon.

It should be understood that the conductive layer 104 can be formed using any appropriate deposition process, such as chemical vapor deposition (CVD), physical vapor deposition (PVD), atomic layer deposition (ALD), or gas cluster ion beam (GCIB) deposition. CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

Although it is specifically contemplated that the present embodiments can be used for the formation of conductive lines, it should be understood that the conductive layer 104 can be replaced by any appropriate non-conducting or semiconducting material to form lines from any material that is called for. For example, the present embodiments can be used to form mandrels that can be used for patterning the underlying substrate layer.

Figure 2:
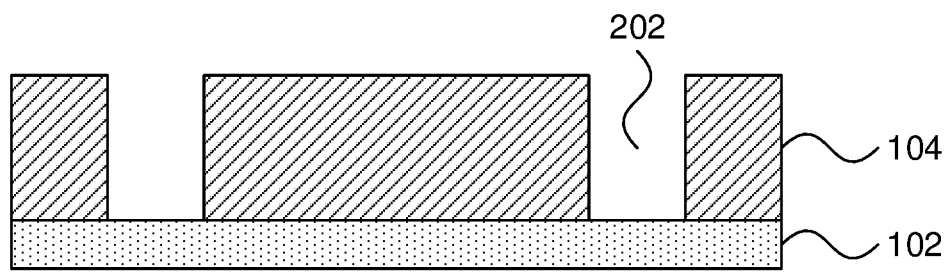
FIG. 2 is a cross-sectional view of a step in the fabrication of conductive lines in a multi-layer integrated chip using subtractive cuts, showing the formation of cuts in the conductive layer that establish plug locations for later interruption of conductive lines, in accordance with an embodiment of the present invention.

Referring now to FIG. 2, a cross-sectional view of a step in the fabrication of a multi-layer integrated chip is shown. Openings 202 are formed in the conductive layer 104. The openings 202 can be formed by, e.g., masking the conductive layer 104 with a photolithographic mask that exposes portions of the top surface of the conductive layer. A photolithographic process can, for example, use a beam of light to expose a portion of a masking material, causing a chemical change in that material. The material can then be "developed" with a developing agent, causing either the exposed or the unexposed region to be removed, leaving the complementary portion. This creates a structure that defines a pattern for a subsequent etch.

An anisotropic etch, such as a reactive ion etch (RIE) can then be used to form the openings by selectively removing material in the exposed portions, around the photolithographic mask. The anisotropic etch penetrates through the conductive layer 104, down to the underlying substrate layer 102, but does not damage the substrate layer 102. As used herein, the term "selective," in reference to a material removal process, denotes that the rate of material removal for a first material is greater than the rate of removal for at least another material of the structure to which the material removal process is being applied.

RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

Figure 3:
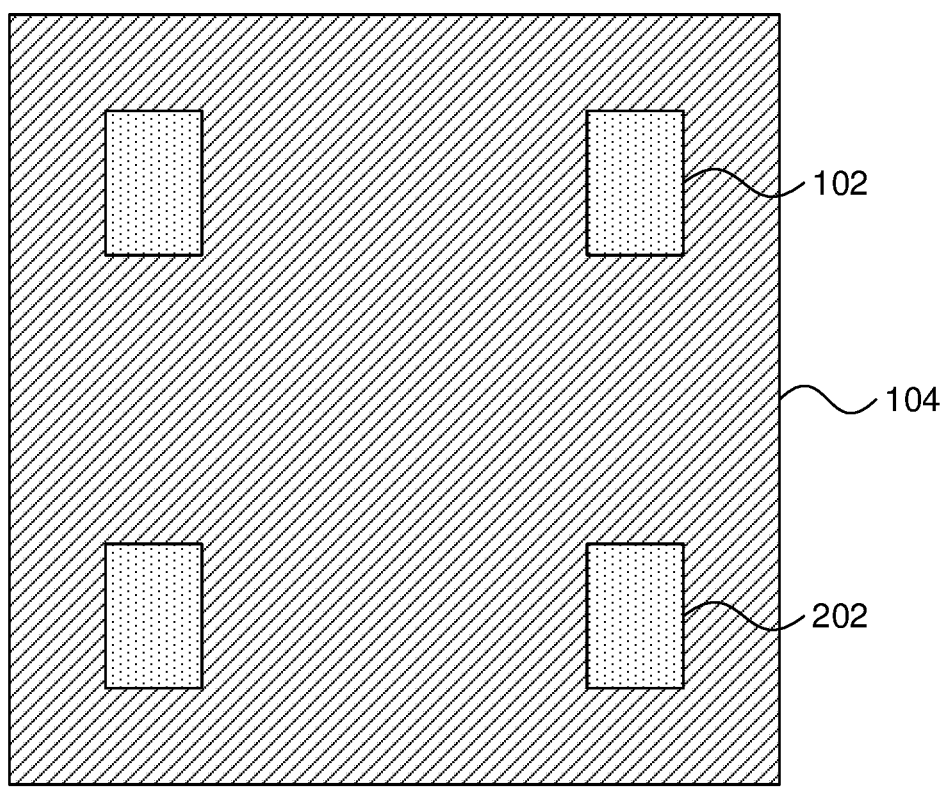
FIG. 3 is a top-down view of a step in the fabrication of conductive lines in a multi-layer integrated chip using subtractive cuts, showing the relative positions of the cuts in the conductive layer, in accordance with an embodiment of the present invention.

Referring now to FIG. 3, a top-down view of a step in the fabrication of a multi-layer integrated chip is shown. The positioning of the openings 202 are shown to provide terminations for the conductive lines that will be formed later in the process. The substrate layer 104 is shown at the bottoms of the openings, with the conductive layer 104 forming an otherwise unbroken layer over the substrate layer 102.

It should be understood that the positioning of the openings 202, shown in FIG. 3, is intended solely for the purpose of illustration. The actual positioning of the openings 202 in a practical embodiment will be dictated by the design needs of the application, and may, for example, be based on the particular electrical interconnect needs for connecting structures to one another in an integrated chip. In this illustrative embodiment, the openings 202 intersect where two different conductive lines will be positioned.

Figure 4:
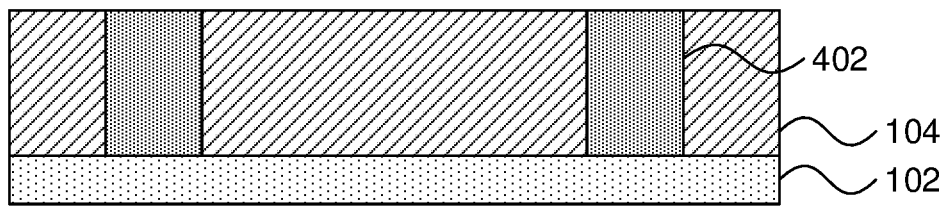
FIG. 4 is a cross-sectional view of a step in the fabrication of conductive lines in a multi-layer integrated chip using subtractive cuts, showing the formation of dielectric plugs in the cuts in the conductive layer, in accordance with an embodiment of the present invention.

Referring now to FIG. 4, a cross-sectional view of a step in the fabrication of a multi-layer integrated chip is shown. Dielectric plugs 402 are formed in the openings 202. The plugs 402 can be formed by, e.g., depositing a layer of dielectric material by any appropriate deposition process, such as CVD, PVD, ALD, or GCIB deposition, and then polishing down to expose the top surface of the conductive layer 104 using, e.g., a chemical mechanical planarization (CMP) process to remove the dielectric material. The dielectric plugs 402 therefore have a height that is defined by the height of the conductive layer 104.

CMP is performed using, e.g., a chemical or granular slurry and mechanical force to gradually remove upper layers of the device. The slurry may be formulated to be unable to dissolve, for example, the conductive material, resulting in the CMP process's inability to proceed any farther than that layer.

Figure 5:
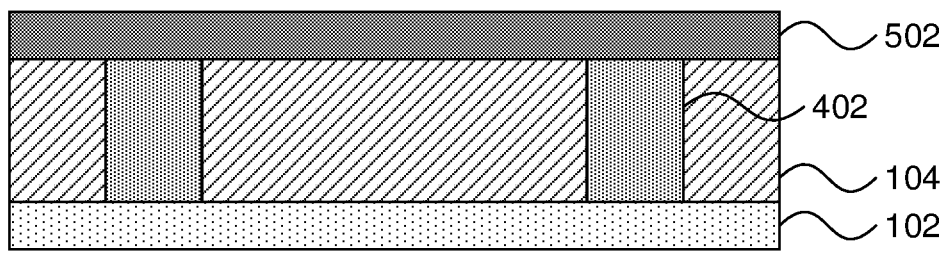
FIG. 5 is a cross-sectional view of a step in the fabrication of conductive lines in a multi-layer integrated chip using subtractive cuts, showing the formation of line pattern mask over the conductive layer and the dielectric plugs, in accordance with an embodiment of the present invention.

Referring now to FIG. 5, a cross-sectional view of a step in the fabrication of a multi-layer integrated chip is shown. A mask 502 is formed over the conductive layer 104. The mask 502 can be formed by a photolithographic process, to establish a pattern for lines. For example, the mask 502 can be patterned with photolithography to follow the paths that conductive lines will follow in the integrated chip.

Figure 6:
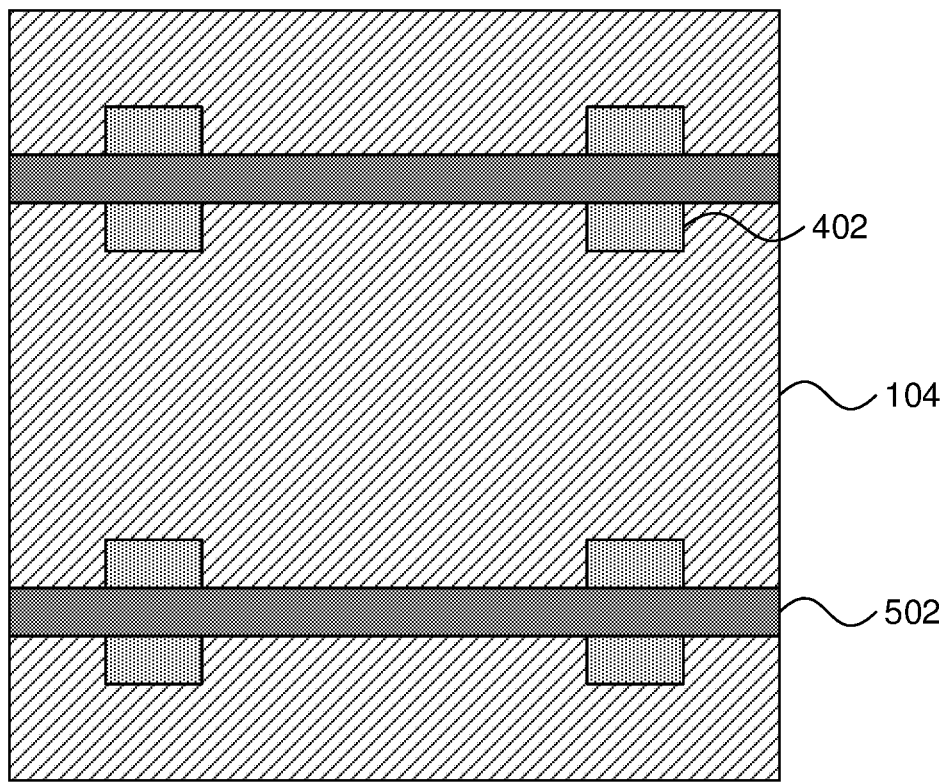
FIG. 6 is a top-down view of a step in the fabrication of conductive lines in a multi-layer integrated chip using subtractive cuts, showing the relative positions of the line pattern mask and the dielectric plugs, in accordance with an embodiment of the present invention.

Referring now to FIG. 6, a top-down view of a step in the fabrication of a multi-layer integrated chip is shown. This view shows the masks 502 being formed across the dielectric plugs 402, establishing line regions that run between the dielectric plugs 202. In at least some embodiments, it is contemplated that the line pattern mask 502 will extend over a dielectric plug 202, crossing from one side to the other. It should be understood that the line pattern masks need not terminate at a dielectric plug 202, but can instead terminate at an open end. The dielectric plugs 402 separate a single line region, defined by the line pattern mask 502, into two or more distinct line regions.

Figure 7:
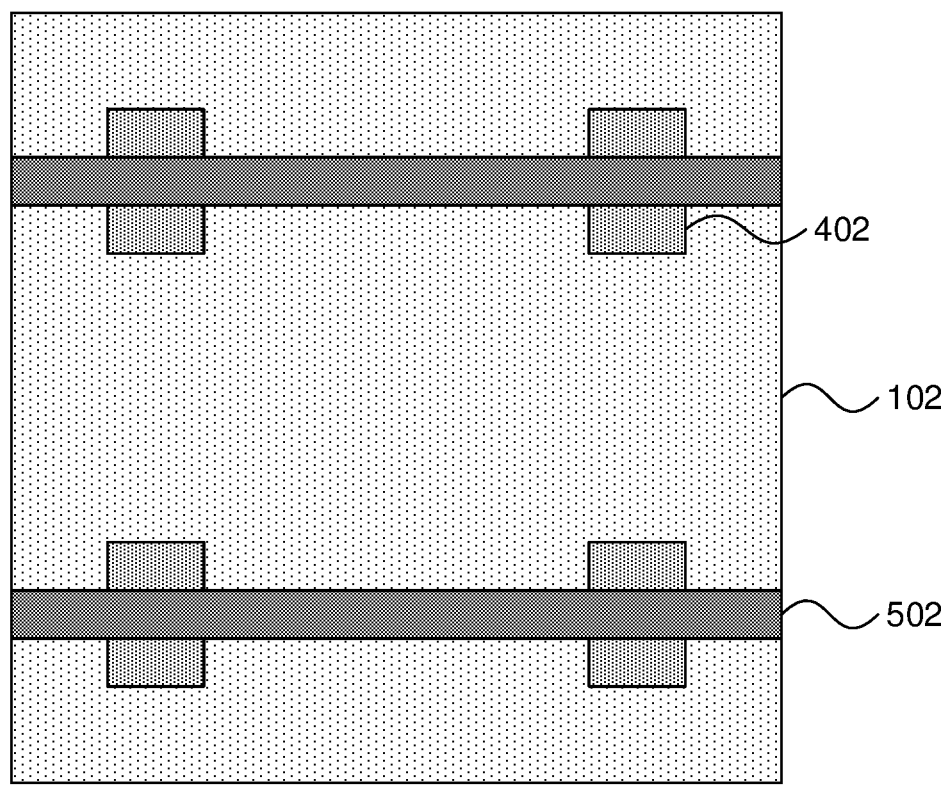
FIG. 7 is a top-down view of a step in the fabrication of conductive lines in a multi-layer integrated chip using subtractive cuts, showing the patterning of the conductive layer around the line pattern mask, in accordance with an embodiment of the present invention.

Referring now to FIG. 7, a top-down view of a step in the fabrication of a multi-layer integrated chip is shown. A selective anisotropic etch is used to remove the exposed portions of the conductive layer 104, exposing the underlying substrate layer 102. The portions of the conductive layer 104 that are protected by the mask 502 form conductive lines, which terminate at the dielectric plugs 402.

Figure 8:
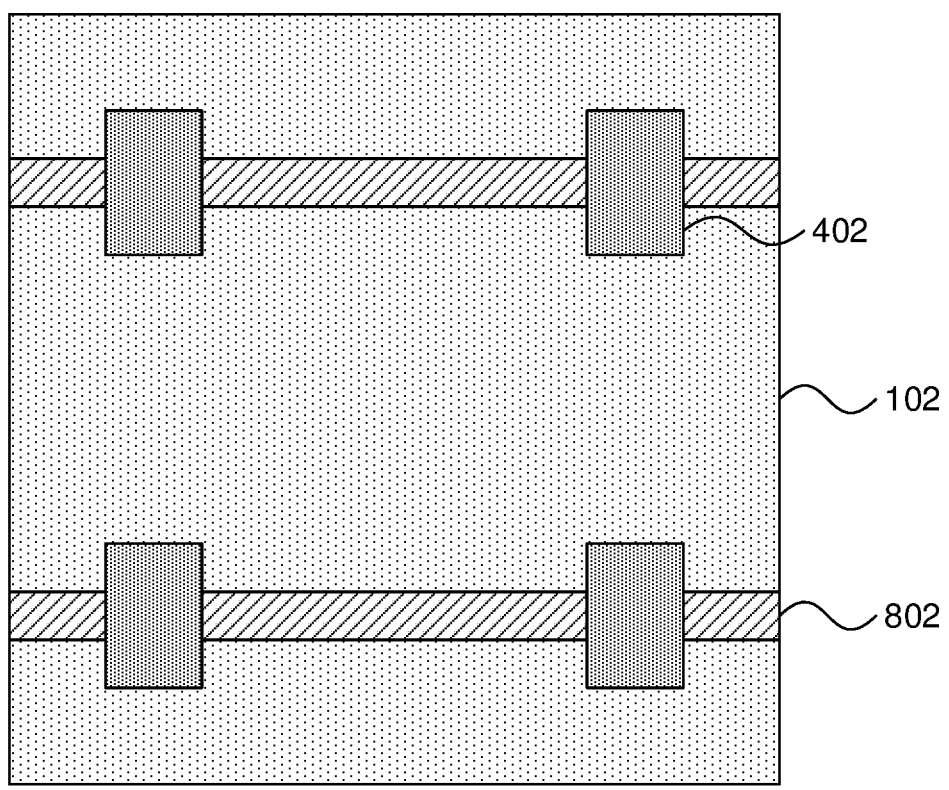
FIG. 8 is a top-down view of a step in the fabrication of conductive lines in a multi-layer integrated chip using subtractive cuts, showing the removal of the line pattern mask to expose the underlying conductive lines, in accordance with an embodiment of the present invention.

Referring now to FIG. 8, a top-down view of a step in the fabrication of a multi-layer integrated chip is shown. The mask 502 is etched away by any appropriately selective isotropic or anisotropic etch process, exposing the underlying conductive lines 802. Because the line pattern mask 502 was positioned across the dielectric plugs 402, the conductive lines intersect with, and terminate at, the dielectric plugs 402.

Figure 9:
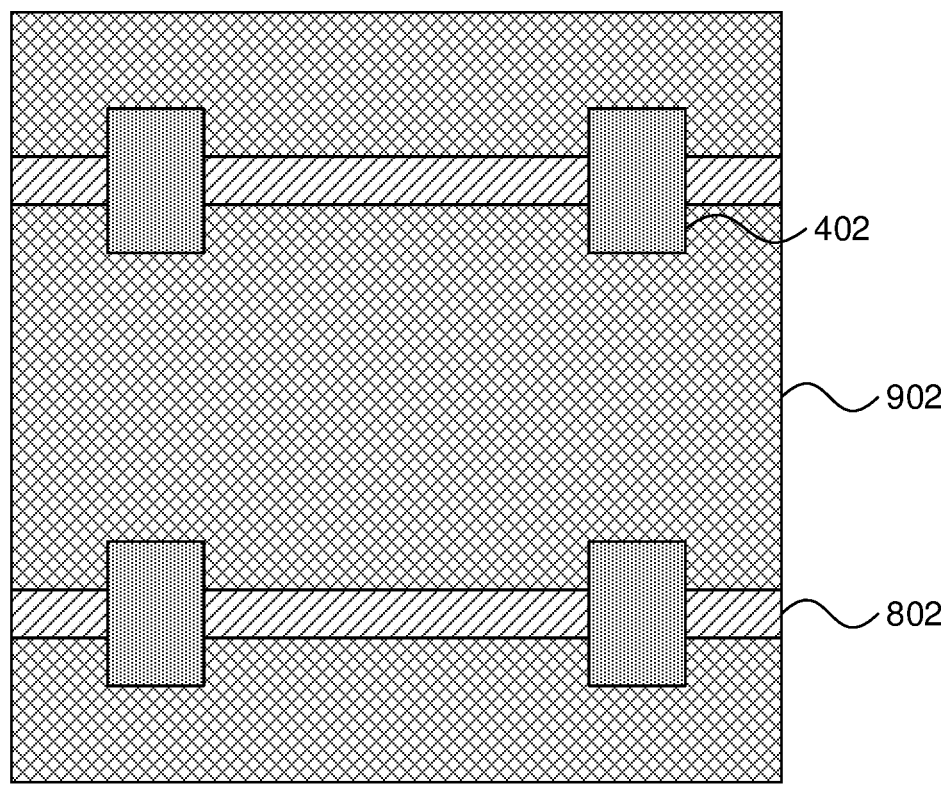
FIG. 9 is a top-down view of a step in the fabrication of conductive lines in a multi-layer integrated chip using subtractive cuts, showing the formation of an interlayer dielectric around the conductive lines and the dielectric plugs, in accordance with an embodiment of the present invention.

Referring now to FIG. 9, a top-down view of a step in the fabrication of a multi-layer integrated chip is shown. A layer of dielectric material is filled in around the conductive lines 802 and the dielectric plugs 402. The dielectric material can be formed by any appropriate deposition process to cover the top surface of the conductive lines 802, and can then be polished back to expose the conductive lines 802 using, e.g., a CMP process that stops on the conductive material, to form the interlayer dielectric 902.

In some embodiments, the dielectric plugs 402 can be etched away, using any appropriately selective isotropic or anisotropic etch, before forming the interlayer dielectric 902. In such embodiments, the interlayer dielectric 902 fills the spaces between ends of the conductive lines 802.

It is specifically contemplated that the interlayer dielectric 902 can be formed form ultra-low-k dielectric material to minimize parasitic capacitance. As used herein, the term "low-k" refers to a material that has a dielectric constant k that is lower than the dielectric constant of silicon dioxide. The term "ultra-low-k" refers to a material that has a dielectric constant substantially lower than that of silicon dioxide. An exemplary low-k dielectric material is SiCOH, with a dielectric constant between about 2.7 and about 3.0. An exemplary ultra-low-k dielectric material is octamethylcyclotetrasiloxane, with a dielectric constant of about 2.7.

An advantage of forming the interlayer dielectric 902 after the cut lines 802 are formed can be that the interlayer dielectric does not include any damage from the etches that would otherwise be used to form the cuts. In particular, although anisotropic etches can be made selective to the material that is being removed, such selectivity is rarely perfect. As a result, neighboring materials can be damaged during the etch. The present embodiments avoid this by forming structures that interrupt the lines, before the interlayer dielectric 902 is ever deposited.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 10:
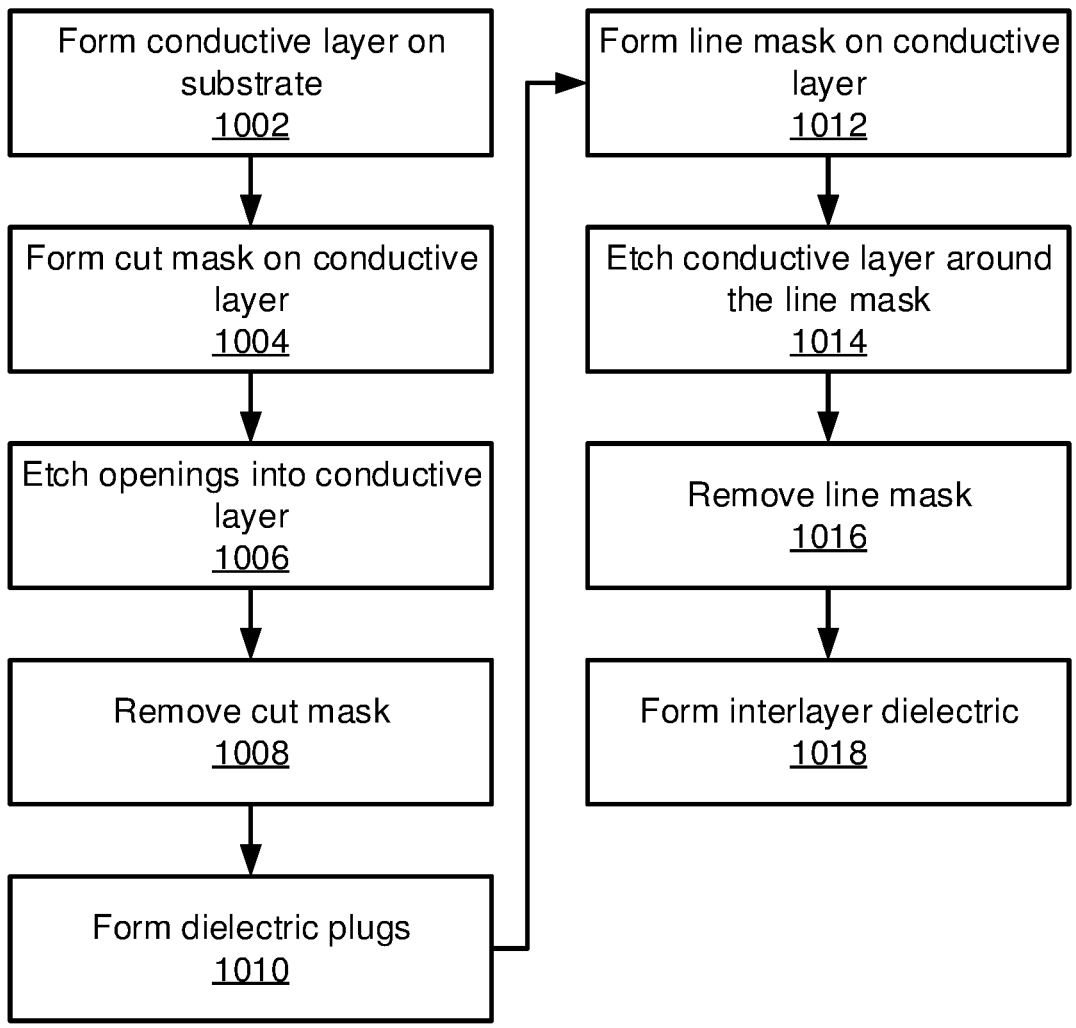
FIG. 10 is a block/flow diagram of a method of fabricating conductive lines in a multi-layer integrated chip using subtractive cuts in accordance with an embodiment of the present invention.

Referring now to FIG. 10, a method for forming conductive lines in a multi-layer integrated chip is shown. Block 1002 forms a conductive layer 104 on a substrate layer 102 using any appropriate deposition process. Block 1004 forms a cut mask over the conductive layer using any appropriate deposition process followed by, e.g., an appropriate photolithograph etching process. Block 1006 uses an anisotropic etch to form openings 202 in the conductive layer 104, by removing the material that is exposed by the cut mask. Block 1008 then etches away the cut mask by any appropriate isotropic or anisotropic etch.

Block 1010 forms the dielectric plugs 402 in the openings 202. Block 1010 deposits dielectric material by any appropriate deposition process and then polished any excess dielectric material away using, e.g., a CMP process that stops on the conductive layer 104.

Block 1012 forms a line mask 502 on the conductive layer 104, using any appropriate photolithographic process, to define a line region. Block 1014 etches down into the conductive layer 104, using an anisotropic etch, to expose the underlying substrate layer 102. Block 1016 then removes the line mask 502, exposing the underlying conductive lines 802, which are cut by dielectric plugs 402. Block 1018 forms interlayer dielectric 902 around the conductive lines 402 by depositing an appropriate dielectric material and polishing the dielectric material down to the height of the conductive lines 802 using a CMP process. In some embodiments, block 1018 can first etch away the dielectric plugs 202 before forming the interlayer dielectric 802, such that the interlayer dielectric material is filled in the cut regions between conductive lines 802.

Having described preferred embodiments of conductive lines with subtractive cuts (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. An integrated chip, comprising:
a dielectric layer, that includes at least one trench and at least one plug region;
a line, formed in the dielectric layer in the at least one trench, that terminates at the plug region; and
a dielectric plug formed in the plug region.

2. The integrated chip of claim 1, wherein the dielectric layer is formed from an ultra-low-k dielectric material.

3. The integrated chip of claim 2, wherein the dielectric layer is formed from octamethylcyclotetrasiloxane.

4. The integrated chip of claim 1, wherein the line is formed from a conductive material.

5. The integrated chip of claim 1, wherein the line is narrower than the dielectric plug.

6. The integrated chip of claim 1, wherein the top surface of the dielectric layer is not damaged by any anisotropic etch.

7. The integrated chip of claim 1, further comprising a second line on a side of the dielectric plug that is opposite to the line.

8. The integrated chip of claim 1, further comprising a second dielectric plug on a side of the conductive line that is opposite to the dielectric plug.

9. The integrated chip of claim 1, wherein the line is in direct contact with a sidewall of the dielectric plug.

10. An integrated chip, comprising:
a dielectric layer, that includes a trench and two plug regions;
a line, formed in the dielectric layer in the trench between the two plug regions, that terminates at the plug regions; and
dielectric plugs formed in the two plug regions.

11. The integrated chip of claim 10, wherein the dielectric layer is formed from octamethylcyclotetrasiloxane.

12. The integrated chip of claim 10, wherein the line is formed from a conductive material.

13. The integrated chip of claim 12, wherein the line is narrower than the dielectric plugs.

14. The integrated chip of claim 10, wherein the top surface of the dielectric layer is not damaged by any anisotropic etch.

15. The integrated chip of claim 10, wherein the line is in direct contact with sidewalls of the dielectric plugs.

16. An integrated chip, comprising:
a dielectric layer, that includes two trenches and a plug regions;
lines, formed in the dielectric layer in the trenches with the plug region between the lines, terminating at the plug region; and
a dielectric plug formed in the plug region.

17. The integrated chip of claim 16, wherein the dielectric layer is formed from octamethylcyclotetrasiloxane.

18. The integrated chip of claim 16, wherein the lines are formed from a conductive material.

19. The integrated chip of claim 16, wherein the line is narrower than the dielectric plugs.

20. The integrated chip of claim 16, wherein the top surface of the dielectric layer is not damaged by any anisotropic etch.

* * * * *